United States Patent
Chen et al.

(10) Patent No.: US 11,435,956 B2
(45) Date of Patent: Sep. 6, 2022

(54) METHOD, ELECTRONIC DEVICE, AND COMPUTER PROGRAM PRODUCT FOR DATA COMPRESSION

(71) Applicant: EMC IP Holding Company LLC, Hopkinton, MA (US)

(72) Inventors: Tao Chen, Beijing (CN); Geng Han, Beijing (CN)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 33 days.

(21) Appl. No.: 17/182,724

(22) Filed: Feb. 23, 2021

(65) Prior Publication Data

US 2022/0236922 A1 Jul. 28, 2022

(30) Foreign Application Priority Data

Jan. 22, 2021 (CN) .......................... 202110088559.4

(51) Int. Cl.
*G06F 3/06* (2006.01)
*H03M 7/40* (2006.01)

(52) U.S. Cl.
CPC .......... *G06F 3/0661* (2013.01); *G06F 3/0608* (2013.01); *G06F 3/0641* (2013.01); *G06F 3/0673* (2013.01); *H03M 7/40* (2013.01)

(58) Field of Classification Search
CPC .... G06F 3/0661; G06F 3/0608; G06F 3/0641; G06F 3/0673; H03M 7/40
See application file for complete search history.

(56) References Cited

U.S. PATENT DOCUMENTS

| | | | | |
|---|---|---|---|---|
| 7,051,152 B1* | 5/2006 | Danilak | ............... | G11B 27/322 711/111 |
| 9,626,373 B2* | 4/2017 | Ram | ..................... | G06F 3/061 |
| 10,833,701 B2* | 11/2020 | Martin | ................ | G06F 16/2365 |
| 2010/0095108 A1* | 4/2010 | Kameyama | ........ | H04N 21/2343 713/150 |
| 2013/0290281 A1* | 10/2013 | Yokoi | ................ | G06F 16/1744 707/693 |
| 2016/0227001 A1* | 8/2016 | Kumano | ................. | H04L 69/04 |
| 2020/0356292 A1* | 11/2020 | Ippatapu | ............... | G06F 3/0608 |
| 2021/0366157 A1* | 11/2021 | Zhu | ........................ | H04N 19/85 |

\* cited by examiner

*Primary Examiner* — Andrew J Cheong
(74) *Attorney, Agent, or Firm* — Womble Bond Dickinson (US) LLP (57) ABSTRACT

Embodiments of the present disclosure provide a method, an electronic device, and a computer program product for data compression. The method includes: determining an amount of data to be compressed in a storage system; determining, based on the amount of the data to be compressed, a target compression level for compressing the data to be compressed; and compressing the data to be compressed according to the target compression level. In this way, it is possible to compress data to be compressed using a compression level corresponding to the amount of the data to be compressed, thereby improving the efficiency of data compression in the storage system.

17 Claims, 5 Drawing Sheets

210

| Data segment size \ Compression level | Static level 1 | Static level 2 | Static level 3 | Static level 4 | Dynamic level 1 | Dynamic level 2 | Dynamic level 3 | Dynamic level 4 |
|---|---|---|---|---|---|---|---|---|
| 1K | 33 | 27 | 24 | 22 | 8 | 8 | 8 | 8 |
| 4K | 77 | 45 | 38 | 32 | 29 | 29 | 27 | 25 |
| 8K | 89 | 50 | 40 | 33 | 50 | 41 | 35 | 29 |
| 16K | 97 | 52 | 41 | 32 | 76 | 47 | 38 | 30 |
| 64K | 104 | 54 | 43 | 34 | 94 | 53 | 42 | 33 |
| 128K | 105 | 50 | 37 | 25 | 86 | 49 | 36 | 25 |

220

| Data segment size \ Compression level | Static level 1 | Dynamic level 1 | Static level 2 | Dynamic level 2 | Static level 3 | Dynamic level 3 | Static level 4 | Dynamic level 4 |
|---|---|---|---|---|---|---|---|---|
| 1K | 64% | 56% | 63% | 55% | 63% | 55% | 63% | 55% |
| 4K | 56% | 46% | 54% | 44% | 53% | 44% | 53% | 44% |
| 8K | 54% | 43% | 50% | 41% | 50% | 41% | 49% | 41% |
| 16K | 52% | 42% | 48% | 40% | 47% | 39% | 47% | 39% |
| 64K | 51% | 41% | 46% | 38% | 45% | 37% | 44% | 36% |
| 128K | 51% | 41% | 46% | 38% | 45% | 37% | 44% | 36% |

230

| Data segment size \ Compression level | Static level 1 | Static level 2 | Static level 3 | Static level 4 | Dynamic level 1 | Dynamic level 2 | Dynamic level 3 | Dynamic level 4 |
|---|---|---|---|---|---|---|---|---|
| 1K | 37.2 | 37.6 | 37.6 | 37.6 | 32.6 | 32.7 | 32.8 | 32.8 |
| 4K | 90.1 | 92.8 | 93.9 | 93.9 | 78.7 | 81.6 | 82.1 | 82.5 |
| 8K | 108.9 | 115.3 | 117.1 | 118 | 99.8 | 105.2 | 106.7 | 107.4 |
| 16K | 120.7 | 130.9 | 133.1 | 135.4 | 115.3 | 123.6 | 126.6 | 128.7 |
| 64K | 131.7 | 145.4 | 148.2 | 152.6 | 129.5 | 142.7 | 146.8 | 149.7 |
| 128K | 133.6 | 148 | 152.5 | 155.7 | 132.5 | 146.6 | 151 | 154.1 |

METHOD, ELECTRONIC DEVICE, AND COMPUTER PROGRAM PRODUCT FOR DATA COMPRESSION

CROSS-REFERENCE TO RELATED APPLICATION

This patent application claims priority, under 35 U.S.C. § 119, of Chinese Patent Application No. 202110088559.4, filed Jan. 22, 2021, which is incorporated by reference in its entirety.

TECHNICAL FIELD

Embodiments of the present disclosure relate to the field of computers, and more particularly, to a method, an electronic device, and a computer program product for data compression.

BACKGROUND

In the era of Big Data, the conflict between the existence of massive data and the limited storage space of storage systems raises the compression need for data storage. It can be understood that the lower a compression rate of data is, the less storage data the compressed data will occupy, and the better the compression effect will be. A better compression rate means a greater logical capacity, more data that can be cached into an SSD cache, and better restoration performance. However, as the compression rate of data decreases, the computation a storage system needs to conduct increases accordingly, and thus the amount of data that can be compressed in the same time also decreases accordingly. That is, in conventional storage systems, the efficiency of data compression is low.

SUMMARY OF THE INVENTION

The embodiments of the present disclosure provide a solution for data compression.

In a first aspect of the present disclosure, a method for data compression is provided. The method includes determining an amount of data to be compressed in a storage system. The method further includes determining, based on the amount of the data to be compressed, a target compression level for compressing the data to be compressed. The method further includes compressing the data to be compressed according to the target compression level.

In a second aspect of the present disclosure, an electronic device is provided, including: a processor; and a memory coupled to the processor, wherein the memory has instructions stored therein that, when executed by the processor, cause the electronic device to perform actions including: determining an amount of data to be compressed in a storage system; determining, based on the amount of the data to be compressed, a target compression level for compressing the data to be compressed; and compressing the data to be compressed according to the target compression level.

In a third aspect of the present disclosure, a computer program product is provided that is tangibly stored on a computer-readable medium and includes machine-executable instructions, wherein the machine-executable instructions, when executed, cause a machine to perform any steps of the method according to the first aspect.

The Summary of the Invention section is provided to introduce the selection of concepts in a simplified form, which will be further described in the Detailed Description below. The Summary of the Invention section is neither intended to identify key features or main features of the present disclosure, nor intended to limit the scope of the present disclosure.

BRIEF DESCRIPTION OF THE DRAWINGS

The above and other objectives, features, and advantages of the present disclosure will become more apparent by describing example embodiments of the present disclosure in detail with reference to the accompanying drawings, and in the example embodiments of the present disclosure, the same reference numerals generally represent the same components. In the accompanying drawings.

DETAILED DESCRIPTION

The principles of the present disclosure will be described below with reference to some example embodiments shown in the accompanying drawings.

As used herein, the term "include" and variations thereof mean open-ended inclusion, that is, "including but not limited to." Unless specifically stated, the term "or" means "and/or." The term "based on" means "based at least in part on." The terms "an example embodiment" and "an embodiment" indicate "a group of example embodiments." The term "another embodiment" indicates "a group of additional embodiments." The terms "first," "second," etc. may refer to different or the same objects. Other explicit and implicit definitions may also be included below.

As discussed above, in a storage system, the compression rate is a ratio of the size of compressed data to the size of original data. The smaller the compression rate of the data, the less space the compressed data occupies, but accordingly, the more computing resources are consumed for compression, so the less amount of data that a storage system with limited computing resources, for example, due to hardware constraints, can compress in unit time, and vice versa. In order to balance the amount of data that the storage system can compress in unit time (herein, sometimes also referred to as data throughput or throughput) and the compression rate, a fixed compression level is usually chosen to compress the data in the storage system to meet the requirements imposed by the two mentioned above. (At this compression level, by using the same hardware device to compress data with the same data segment size, the compressed data obtained will have a roughly fixed compression rate.

However, since the data throughput may vary in real time over time, the compression level generally cannot be chosen to be too high for storage systems with potentially large peaks in data throughput, which will lead to insufficient data compression and a waste of storage space and/or computing resources when the real-time data throughput is small.

In order to address, at least in part, the above disadvantages, the embodiments of the present disclosure provide a solution for data compression, so as to adaptively determine, based on an amount of data to be compressed, a compression level for data compression. With this solution, it is possible to determine in real time the amount of data to be compressed, and select a compression level that matches the amount of the data to be compressed for compression.

Figure 1:
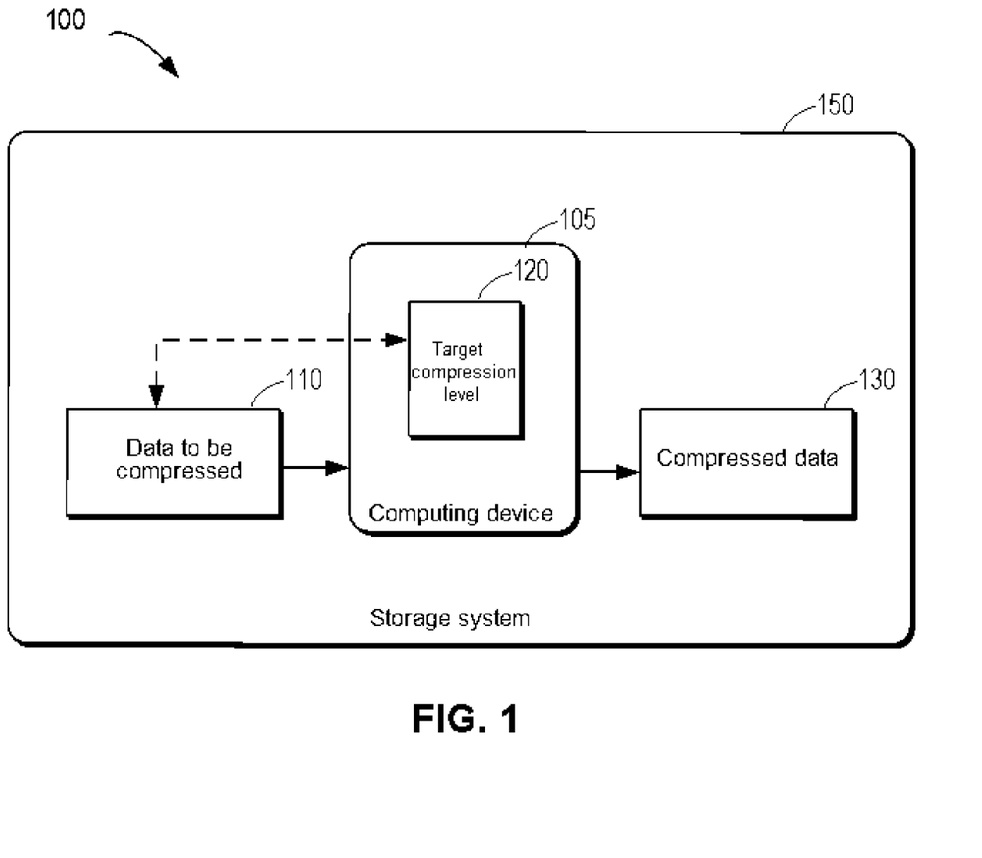
FIG. 1 illustrates a schematic diagram of an example environment according to embodiments of the present disclosure.

Based on such solution for data compression, since the compression level used by the storage system is adapted to the amount of data to be compressed, it is possible to improve the overall compression rate for the data and thus improve the efficiency of utilization of storage space and/or computing resources of the storage system FIG. 1 illustrates a schematic diagram of example environment 100 according to embodiments of the present disclosure, in which a device and/or method according to embodiments of the present disclosure can be implemented. As shown in FIG. 1, as shown in FIG. 1, the example environment may include storage system 150. Storage system 150 may include computing device 105 for processing various operations for data storage, including but not limited to data compression and decompression, data de-duplication, data storage, data backup, and data recovery.

Storage system 150 may include (multiple) storage disk(s), not shown, for storing data. The storage disks can be various types of devices with a storage function, including but not limited to a hard disk drive (HDD), a solid state disks (SSD), a removable disk, any other magnetic storage device and any other optical storage device, or any combination thereof.

Computing device 105 can be configured to compress data to be compressed 110 to acquire compressed data 130. Compressed data 130 can be stored in a storage disk to save storage space of the storage disk.

In some embodiments, storage system 150 may be a storage system for data backup, which is configured with a duplicate data deletion (sometimes also referred to as de-duplication or data de-duplication herein) device to remove duplicate portions of the data and store only the non-duplicate portions, thereby enabling efficient usage of the storage space. Storage system 150 can further compress the de-duplicated data. In some embodiments, storage system 150 can compress data through various compression techniques such as QuickAssist Accelerated Compression Technology (QAT) with corresponding co-processors. In some embodiments, storage system 150 can be set to compress data using various compression levels provided by various compression techniques.

It can be understood that, in some cases, the amount of data to be compressed 110 may vary over time. For example, in the case of storing data that is not backed up for the first time, the amount of the de-duplicated data (in other words, the amount of the data to be compressed) is much smaller than the amount of the original data. Therefore, if the storage system can provide the same computing resources, the data in such case can be compressed using a better compression level to achieve various benefits of taking advantage of a high compression rate, such as a logical capacity, more data that can be cached into an SSD cache, and better restoration performance.

Thus, storage system 150 (e.g., computing device 150 of the storage system) can compress data to be compressed 110 according to target compression level 130 that matches the amount of data to be compressed 110, to make compressed data 130 as small as possible while ensuring that a latency requirement of the data processing operation is met.

The process according to embodiments of the present disclosure will be described in detail below with reference to FIGS. 2 to 6. For ease of understanding, specific data mentioned in the following description are all examples and are not intended to limit the scope of protection of the present disclosure. It should be understood that the embodiments described below may also include additional actions not shown and/or may omit actions shown, and the scope of the present disclosure is not limited in this regard.

Figure 2:
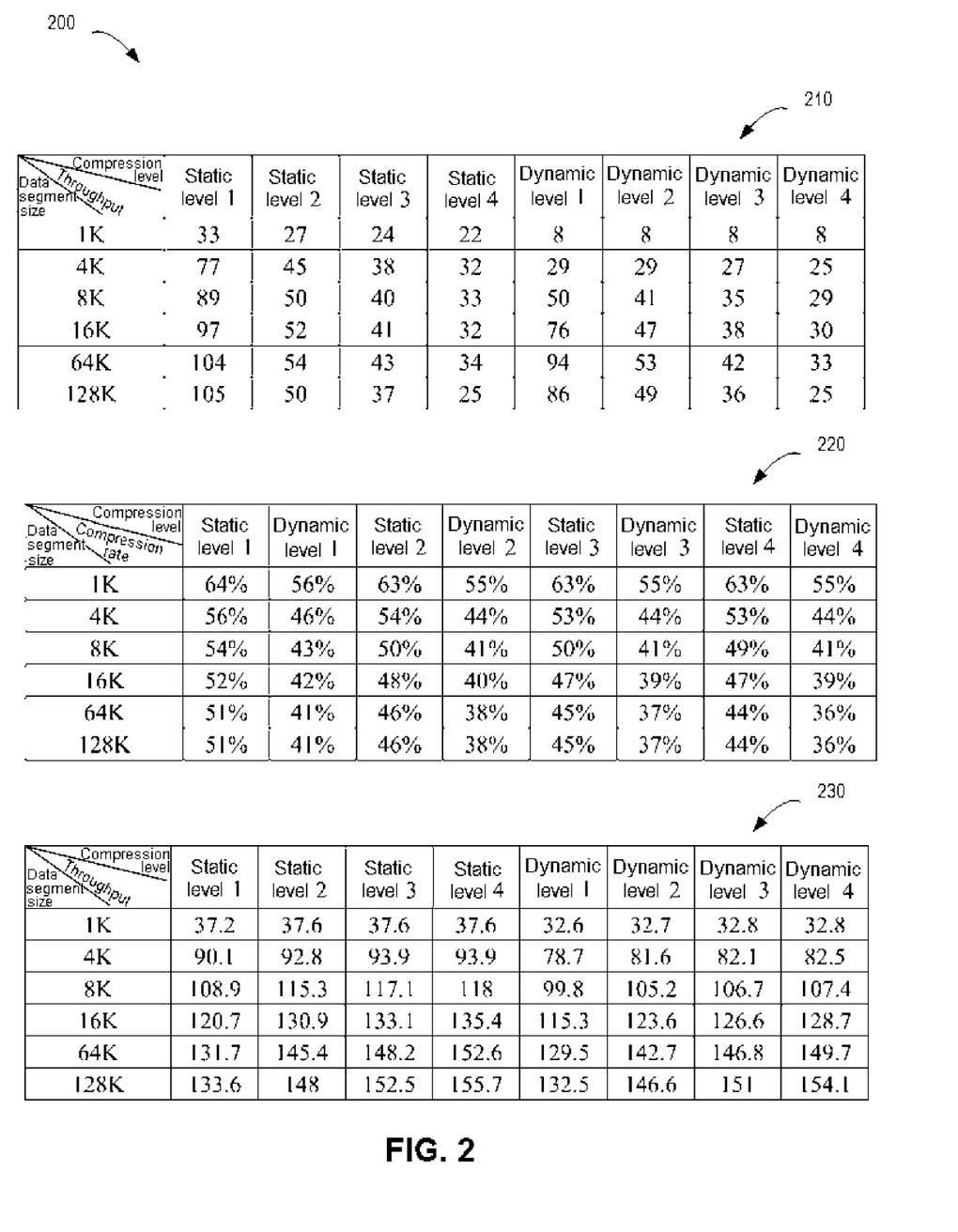
FIG. 2 illustrates a schematic diagram of various charts of various indexes related to compression levels.

FIG. 2 illustrates schematic diagram 200 of multiple tables of various indexes related to compression levels. It should be noted that FIG. 2 only illustrates charts of various indexes corresponding to various compression levels provided by the QAT compression technique in the same hardware configuration. It can be understood that, in the case of adopting other different hardware configurations and/or adopting other compression techniques, similar charts can be obtained by those skilled in the art through testing of the storage system.

Table 210 illustrates amounts of data, i.e., throughput (GB/s), that the storage system can compress at various compression levels in unit time (second, s) according to embodiments of the present disclosure. Compression and/or decompression can be of two types, dynamic and static, which can refer to dynamic Huffman data compression and/or decompression, and static Huffman data compression and/or decompression, respectively.

For example, the QAT compression technique can provide dynamic compression level 1 to dynamic compression level 4 (sometimes also briefly referred to as dynamic level herein), and static compression level 1 to static compression level 4 (sometimes also briefly referred to as static level herein). The throughput varies at different compression levels. Additionally, the data segment size, e.g., 1K, 4K, 8K, 16K, and 64K (in a unit of bits B), may also affect the throughput.

Table 220 illustrates the ratio of data compressed by the storage system to the data size, i.e., the compression rate, at various compression levels according to embodiments of the present disclosure. As can be seen from Table 220, a better compression level can provide a lower compression rate for the same data, in other words, less storage space is required by the compressed data.

As can be seen from Table 210 and Table 220, a better compression level corresponds to a lower throughput, in other words, the amount of data that the storage system can compress in unit time is less. If a better compression level is still used in case of a large amount of data to be compressed, an overall latency in data compression of the storage system will be caused. Thus, the compression latency may vary significantly depending on the compression level.

Table 230 illustrates amounts of data, i.e., throughput (GB/s), compressed according to various compression levels that the storage system can decompress in unit time (second, s) according to embodiments of the present disclosure. As can be seen from Table 230, there is little difference in the amount of data that the storage system can decompress at different compression levels, so the decompression latency will not vary significantly with the compression level. With substantially the same decompression latency, decompression of data that were compressed at a higher compression level yields more data in unit time.

It can be understood that, in the case of adopting other different hardware configurations and/or adopting other compression techniques, the exact values of various indexes similar to those shown in the above charts can vary, but the relationships therebetween are similar to those described above with reference to the above charts.

Figure 3:
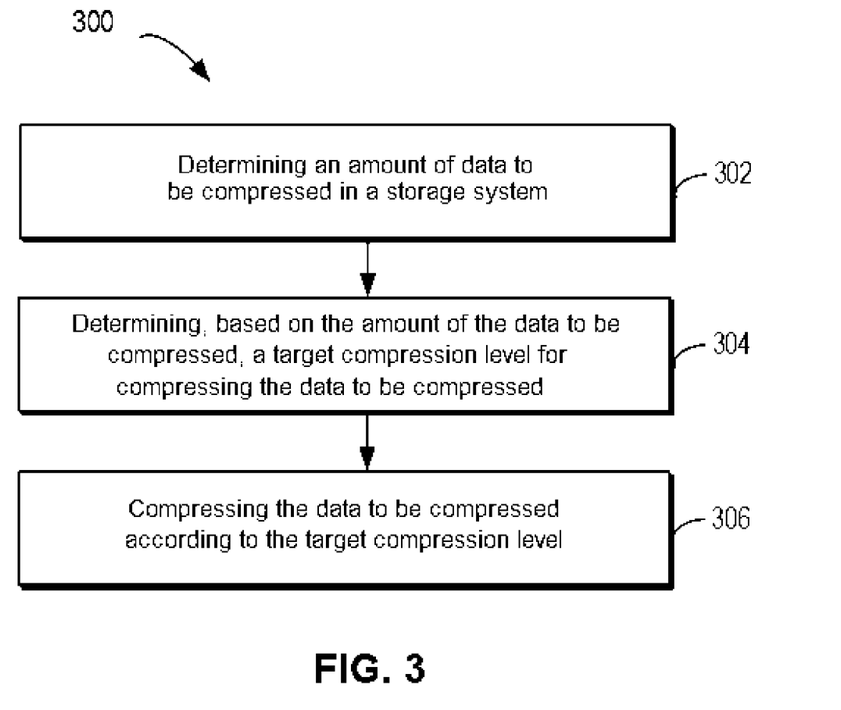
FIG. 3 illustrates a flow chart of a process for data compression according to embodiments of the present disclosure.

FIG. 3 illustrates a flow chart of process 300 for data compression according to embodiments of the present disclosure. Process 300 can be implemented at computing device 105 shown in FIG. 1.

At 302, computing device 105 can determine the amount of data to be compressed 110 in storage system 150.

Specifically, the data to be compressed is the data that is expected to be subject to compression processing using various compression techniques or algorithms. In some embodiments, the data to be compressed may be data to be stored (e.g., to be backed up) in the storage system. In some embodiments, the data to be compressed may also be data obtained after the above data to be stored is de-duplicated. The data may be stored to a storage disk after compression processing for subsequent retrieval.

In some other embodiments, the stored data that has been stored in the storage disk is also expected to be compressed using various compression techniques or algorithms when, for example, data recovery processing such as garbage collection is performed, and the data to be compressed can also be data to be recovered.

The amount of data can be obtained in various ways. In some embodiments, this can be achieved by using various monitors of a memory, so as to monitor parameters of the size of the amount of data in real time and, additionally or alternatively, to calculate the amount of data to be compressed using such parameters. For example, for the data to be stored, this can be achieved by detecting the traffic of data that is input into the storage system or a network bandwidth.

At 304, computing device 105 can determine, based on the amount of data to be compressed 110, target compression level 120 for compressing data to be compressed 110.

It can be understood that the better the compression level, the higher the compression rate, and thus the less storage space required by the compressed data. However, the storage system usually needs to meet certain latency requirements when processing data. In some cases, for a large amount of data to be compressed in unit time, using, for example, the best compression level is likely to cause the storage system to take an overly long time to perform data processing, thus failing to meet a predetermined latency requirement. In some other cases, for a small amount of data to be compressed in unit time, using, for example, the worst compression level can meet the predetermined delay requirement, but it may lead to unnecessary occupation of storage space.

Thus, the computing device can select the optimal compression level compatible with the amount of data to be compressed according to the amount of the data to be compressed, so that the predetermined latency requirement can be met while the compression rate of the compressed data is maximized.

At 306, computing device 105 can compress the data to be compressed according to target compression level 120. Compressed data 130 can be further stored in a storage disk.

In this way, the computing device can determine a compression level corresponding to the amount of the data to be compressed and use the same to compress the data to be compressed, thereby improving the efficiency of data compression in the storage system.

It can be understood that computing device 105 can dynamically adjust the target compression level as the amount of the data to be compressed changes, so that the compression level used is capable of compressing the data to be compressed in time without causing an excessive latency. In some embodiments, in response to a change in the computing resources in the storage system that are available to compress the data to be compressed and/or the amount of the data to be compressed, computing device 105 can update the target compression level by, for example, performing steps 302-204 above again.

In situations where, for example, the amount of data to be compressed in unit time decreases and/or the computing resources in the storage system that are available to compress data increase, the computing device can determine whether to compress the data using a higher compression level, so as to obtain a higher compression rate of the data and thereby save storage space; whereas in situations where, for example, the amount of data to be compressed in unit time increases and/or the computing resources in the storage system that are available to compress data decrease, the computing device can determine whether to compress the data using a lower compression level, so as to increase the amount of data that the storage system can process using the limited computing resources by reducing the compression rate of the data. In this way, it is possible to achieve adaptive adjustment of the compression rate, maximize the utilization of computing resources of the storage system, improve the efficiency of data compression in the storage system, and save storage space.

Figure 4:
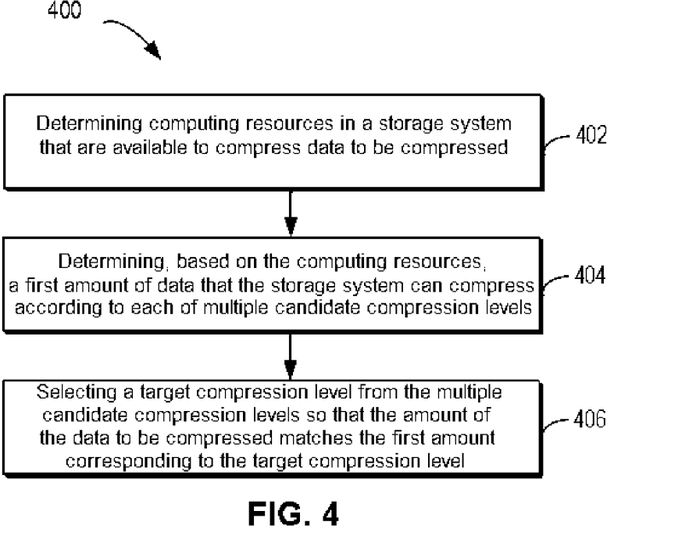
FIG. 4 illustrates a flow chart of a process for determining a target compression level according to embodiments of the present disclosure

FIG. 4 illustrates a flow chart of process 400 for determining a target compression level according to embodiments of the present disclosure. Process 400 can be implemented at computing device 105 shown in FIG. 1.

At 402, computing device 105 can determine computing resources in storage system 150 that are available to compress data to be compressed 110.

Specifically, the total computing resources that the storage system can provide will be fixed if the hardware configuration of the storage system remains unchanged, wherein the total computing resources are associated with, for example, the hardware configuration and/or operation parameters of a co-processor dedicated to compression operations. However, there may be cases where not all computing resources are used for data compression. Therefore, the amount of data that the storage system can compress according to various compression levels may also change over time.

In some embodiments, the computing device can detect the ratio (sometimes referred to as utilization herein) of an available portion of computing resources of the storage system to the total computing resources of the storage system. The computing device can determine computing resources that are available to compress the data to be compressed based on the total computing resources and the ratio described above. The above ratio can be obtained, for example, by means of a utilization monitor.

At 404, computing device 105 can determine, based on the above computing resources, a first amount of data that storage system 150 can compress according to each of multiple candidate compression levels.

It can be understood that, since computing resources consumed to compress the same amount of data according to various compression levels are not the same, the throughput corresponding to each candidate compression level based on the allocated computing resources can be determined for the determination of the target compression level.

In some embodiments, the computing device can acquire a compression-level mapping table associated with total computing resources of the storage system. The compression-level mapping table may include the correspondence between the multiple candidate compression levels and multiple second amounts, each second amount being the amount of data (i.e., throughput) that the storage system can compress according to a corresponding candidate compression level. For example, Table 1 below shows an example of a compression-level mapping table for compression of a 128 KB data segment.

TABLE 1

| Compression level | Throughput (GB/s) |
|---|---|
| Static level 1 | 105 |
| Dynamic level 1 | 86 |
| Dynamic level 2 | 49 |
| Dynamic level 3 | 36 |
| Dynamic level 4 | 25 |

The data in the compression-level mapping table can be acquired based on testing of the storage system. In the example of Table 1 above, its data corresponds according to the tables shown in FIG. 2 above. It can be understood that the candidate compression levels included in the compression-level mapping table can be selected based on the compression effect provided by each compression level of various compression techniques, so that the compression rate can be optimized for each range of throughput and, additionally or alternatively, for each data segment size.

The computing device can determine the first amount corresponding to each candidate compression level based on the compression-level mapping table and the determined computing resources.

For example, if the ratio of the determined computing resources to the total computing resources is 50%, the amount of data that can be compressed according to static level 1, dynamic level 1, dynamic level 2, dynamic level 3, and dynamic level 4 can be determined to be 52.5, 43, 24.5, 18, and 12.5 respectively based on, for example, the compression-level mapping table in Table 1 above.

At 406, computing device 105 can select target compression level 120 from the multiple candidate compression levels, so that the amount of data to be compressed 110 matches the first amount corresponding to target compression level 120.

The selected target compression level can be a compression level that can meet the latency requirement of the storage system while providing an optimal compression rate. More specifically, at the selected target compression level, the amount of data to be compressed that the storage system can compress is exactly greater than or equal to the amount of the data to be compressed.

For example, if it is determined that all computing resources are available for compression and the amount of the data to be compressed is 40 GB/s, dynamic level 2 matching that amount can be selected for compressing the data to be compressed.

If it is determined that all computing resources are available for compression and the amount of the data to be compressed changes, for example, to 20 GB/s due to a change in the de-duplication rate, dynamic level 4 matching that amount can be selected for compressing the data to be compressed.

If it is determined that the ratio of the available computing resources to the total computing resources changes to 50% and the amount of the data to be compressed is 20 GB/s, dynamic level 2 matching that amount can be selected for compressing the data to be compressed.

In some embodiments, the computing device can select, according to data segment size of the data to be compressed, a compression-level mapping table which includes multiple candidate compression levels and matches that data segment size, and select therefrom a target compression level that matches both the amount of the data to be compressed and the data segment size therein.

In this way, the computing device can select the optimal compression level to compress the data to be compressed, so that the storage space occupied by the compressed data can be saved.

Figure 5:
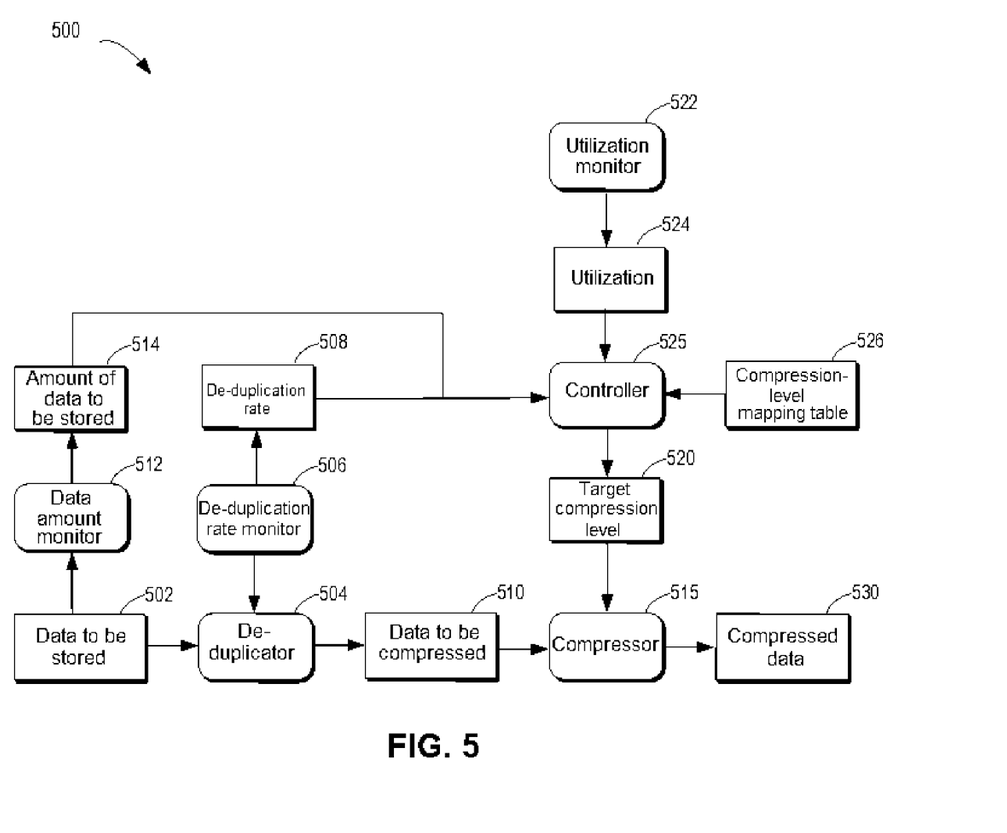
FIG. 5 illustrates a schematic diagram of a process for data compression in a task of data storage according to embodiments of the present disclosure.

FIG. 5 illustrates a schematic diagram of process 500 for data compression in a task of data storage according to embodiments of the present disclosure. Process 500 can be implemented at computing device 105 shown in FIG. 1.

Computing device 105 can determine an amount of data to be stored that will be stored to the storage system. For example, computing device 105 can be configured with data amount monitor 512 for counting the amount of data to be stored 502 to determine amount 514 of the data to be stored.

Computing device 105 can determine a de-duplication rate of the data to be stored. For data to be stored 502, the computing device can be configured, for example, with de-duplicator 504 to remove portions of data to be stored 502 that are duplicates of the stored data. The de-duplicated data to be stored can be used as data to be compressed 510.

The computing device can be configured with de-duplication rate monitor 506 to, for example, monitor the operation of de-duplicator 504 in real time to determine de-duplication rate 506 of data to be stored 502.

Computing device 105 can determine the amount of data to be compressed 510 based on the amount of the data to be stored and the de-duplication rate. For example, if the amount of the data to be stored is 100 GB/s and the de-duplication rate is 60%, the amount of the data to be compressed can be determined to be equal to 100×(1−60%)= 40 GB/s. The above process for determination of the amount of the data to be compressed can be configured to be performed, for example, at controller 525 of computing device 105.

In this way, when selecting a compression level for data compression, the effect of the de-duplication rate can be taken into account to more accurately select the target compression level and improve the efficiency of data compression in the storage system.

The computing device may also include utilization monitor 522 configured to monitor in real time the ratio of computing resources available for compression to the total computing resources and determine it as utilization 524. In some embodiments, utilization monitor 522 can determine utilization 524 for each of different tasks that are being performed at the same time. For example, utilization monitor 522 can determine the utilization of a compression task associated with data to be stored, the utilization of a compression task associated with data to be subject to collection processing (to be described in more detail below), and the utilization of other tasks (e.g., a decompression task).

Controller 525 can also be configured to determine the amount of data to be compressed based on predetermined compression-level mapping table 526, the amount of the data to be compressed, the data segment size information of the data to be compressed, utilization 524, and/or the total computing resources of the storage system, and select appropriate target compression level 520 accordingly. The selecting process for target compression level 520 has been described above with reference to FIGS. 3 and 4 and will not be repeated herein.

Using selected target compression level 520, compressor 515 of computing device 105 can execute a compression algorithm on data to be compressed 510 to acquire compressed data 530. In some embodiments, compressor 515 can be implemented by a co-processor using the QAT technology.

Figure 6:
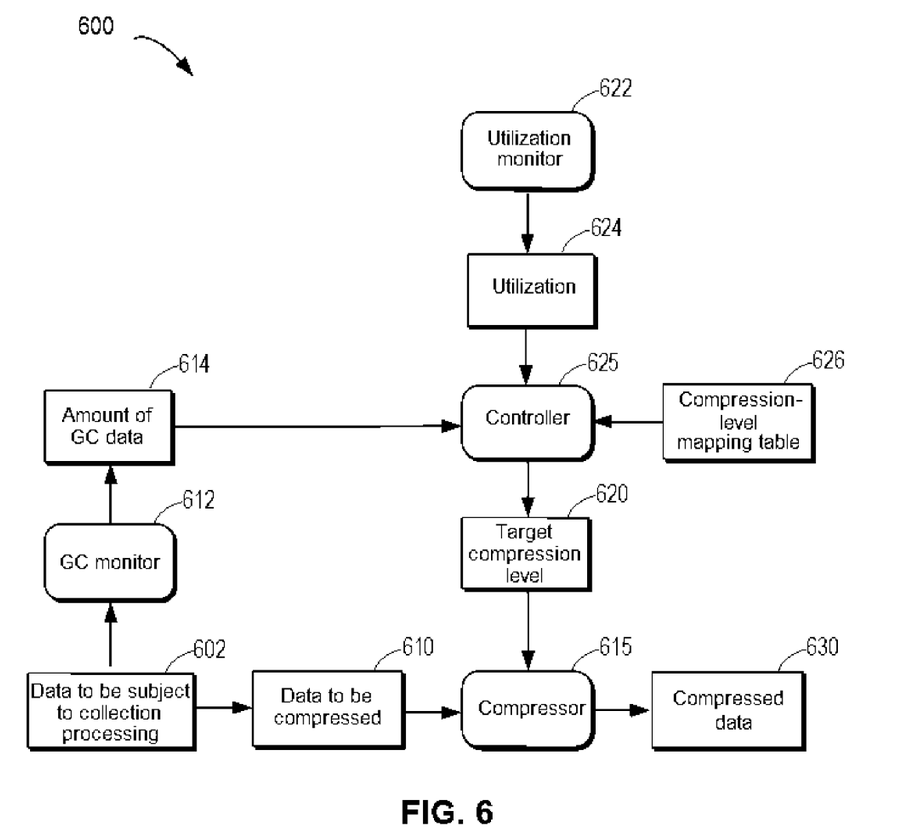
FIG. 6 illustrates a schematic diagram of a process for data compression in a task of data collection processing according to embodiments of the present disclosure.

FIG. 6 illustrates a schematic diagram of process 600 for data compression in a task of data collection processing according to embodiments of the present disclosure. Process 600 can be implemented at computing device 105 shown in FIG. 1.

Data collection processing is sometimes also referred to as garbage collection (GC) processing. It can be understood that data collection processing is not performed all the time in a storage system and is usually performed when the storage system is idle (i.e., not all the computing resources in the storage system are being utilized).

Data collection processing involves decompression and re-compression to reorganize data on a storage disk. It can be expected that, in data collection processing, the data initially compressed at a worse compression level is re-compressed using a better compression level, so that the storage space on the storage disk is further saved. It can be understood that the throughput requirement of the system also needs to be met during the data collection processing.

Computing device 105 can determine the amount of data to be subject to collection processing 602 in the storage system. This can be achieved, for example, by means of GC monitor 612 in the computing device. The GC monitor is configured to count the amount of data to be subject to collection processing 602 in real time, so as to determine amount 614 of the data to be subject to collection processing.

Based on amount 614 of the data to be subject to collection processing, computing device 105 can determine the amount of the data to be compressed. This can be configured, for example, to be performed at controller 625 of computing device 105.

Computing device 105 may include utilization monitor 622 for determining utilization 624 (e.g., the utilization of a compression task associated with the data to be subject to collection processing). Utilization monitor 622 is similar to utilization monitor 522 described with reference to FIG. 5 and will not be repeated herein.

Controller 625 can also be configured to determine the amount of data to be compressed based on predetermined compression-level mapping table 626, the amount of the data to be compressed, the data segment size information of the data to be compressed, utilization 624, and/or the total computing resources of the storage system, and select appropriate target compression level 620 accordingly. The selecting process for target compression level 620 has been described above with reference to FIGS. 3 and 4 and will not be repeated herein.

After decompression, data to be subject to collection processing 602 can be treated as data to be compressed 610 for re-compression to achieve a better compression rate.

Using selected target compression level 620, compressor 615 of computing device 105 can execute a compression algorithm on data to be compressed 610 to acquire compressed data 630. In some embodiments, compressor 615 can be implemented by a co-processor using the QAT technology.

In this way, it is possible to select an optimal compression level for the data to be subject to collection processing, such that the compression rate of data after collection processing is higher, the storage space is saved, and the storage efficiency of the storage system is improved.

Figure 7:
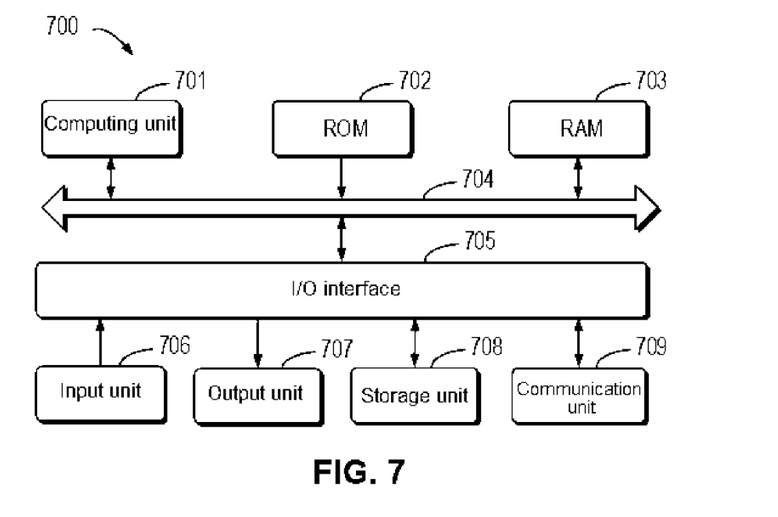
FIG. 7 illustrates a block diagram of an example device that can be used to implement embodiments of the present disclosure.

FIG. 7 illustrates a schematic block diagram of example electronic device 700 that can be used to implement the embodiments of the present disclosure. For example, electronic device 700 can be used to implement computing device 105 shown in FIG. 1. As shown in the figure, device 700 includes central processing unit (CPU) 701 that may perform various appropriate actions and processing according to computer program instructions stored in read-only memory (ROM) 702 or computer program instructions loaded from storage unit 708 into random access memory (RAM) 703. In RAM 703, various programs and data required for the operation of device 700 may also be stored. CPU 701, ROM 702, and RAM 703 are connected to one another through bus 704. Input/output (I/O) interface 705 is also connected to bus 704.

Multiple components in device 700 are connected to I/O interface 705, including: input unit 706, such as a keyboard and a mouse; output unit 707, such as various types of displays and speakers; storage unit 708, such as a magnetic disk and an optical disk; and communication unit 709, such as a network card, a modem, and a wireless communication transceiver. Communication unit 709 allows device 700 to exchange information/data with other devices via a computer network such as the Internet and/or various telecommunication networks.

Processing unit 701 executes various methods and processing described above, e.g., any one of processes 300 to 600. For example, in some embodiments, any one of processes 300 to 600 may be implemented as a computer software program or a computer program product that is tangibly included in a machine-readable medium, e.g., storage unit 708. In some embodiments, part or all of the computer program may be loaded and/or installed to device 700 via ROM 702 and/or communication unit 709. When the computer program is loaded into RAM 703 and executed by CPU 701, one or more steps of any one of processes 300 to 600 described above may be performed. Alternatively, in other embodiments, CPU 701 may be configured in any other suitable manner (e.g., by means of firmware) to implement any one of processes 300 to 600.

The present disclosure may be a method, an apparatus, a system, and/or a computer program product. The computer program product may include a computer-readable storage medium on which computer-readable program instructions for performing various aspects of the present disclosure are loaded.

The computer-readable storage medium may be a tangible device capable of retaining and storing instructions used by an instruction-executing device. For example, the computer-readable storage medium may be, but is not limited to, an electrical storage device, a magnetic storage device, an optical storage device, an electromagnetic storage device, a semiconductor storage device, any non-transitory storage device, or any appropriate combination of the above. More specific examples (a non-exhaustive list) of the computer-readable storage medium include: a portable computer disk, a hard disk, a random access memory (RAM), a read-only memory (ROM), an erasable programmable read-only memory (EPROM or a flash memory), a static random access memory (SRAM), a portable compact disc read-only memory (CD-ROM), a digital versatile disc (DVD), a memory stick, a floppy disk, a mechanical encoding device, for example, a punch card or a raised structure in a groove with instructions stored thereon, and any appropriate combination of the foregoing. The computer-readable storage medium used herein is not to be interpreted as transient signals per se, such as radio waves or other freely propagating electromagnetic waves, electromagnetic waves propagating through waveguides or other transmission media (e.g., light pulses through fiber-optic cables), or electrical signals transmitted through electrical wires.

The computer-readable program instructions described herein can be downloaded from a computer-readable storage medium to various computing/processing devices, or downloaded to an external computer or external storage device via a network, such as the Internet, a local area network, a wide area network, and/or a wireless network. The network may include copper transmission cables, fiber optic transmission, wireless transmission, routers, firewalls, switches, gateway computers, and/or edge servers. A network adapter card or network interface in each computing/processing device receives computer-readable program instructions from the network and forwards the computer-readable program instructions for storage in the computer-readable storage medium in each computing/processing device.

The computer program instructions for executing the operation of the present disclosure may be assembly instructions, instruction set architecture (ISA) instructions, machine instructions, machine-dependent instructions, microcode, firmware instructions, state setting data, or source code or object code written in any combination of one or more programming languages, the programming languages including object-oriented programming languages, such as Smalltalk, C++, and the like, and conventional procedural programming languages, such as the C language or similar programming languages. The computer-readable program instructions may be executed entirely on a user's computer, partly on a user's computer, as a stand-alone software package, partly on a user's computer and partly on a remote computer, or entirely on a remote computer or a server. In the case where a remote computer is involved, the remote computer may be connected to a user computer over any kind of networks, including a local area network (LAN) or a wide area network (WAN), or may be connected to an external computer (e.g., connected over the Internet using an Internet service provider). In some embodiments, an electronic circuit, for example, a programmable logic circuit, a field programmable gate array (FPGA), or a programmable logic array (PLA), is personalized by utilizing state information of the computer-readable program instructions, wherein the electronic circuit may execute computer-readable program instructions so as to implement various aspects of the present disclosure.

Various aspects of the present disclosure are described herein with reference to flow charts and/or block diagrams of the method, the apparatus (system), and the computer program product according to embodiments of the present disclosure. It should be understood that each block of the flow charts and/or block diagrams and combinations of blocks in the flow charts and/or block diagrams can be implemented by computer-readable program instructions.

These computer-readable program instructions can be provided to a processing unit of a general-purpose computer, a special-purpose computer, or a further programmable data processing apparatus, thereby producing a machine, so that these instructions, when executed by the processing unit of the computer or the further programmable data processing apparatus, produce means for implementing functions/actions specified in one or more blocks in the flow charts and/or block diagrams. These computer-readable program instructions may also be stored in a computer-readable storage medium, and these instructions cause a computer, a programmable data processing apparatus, and/or other devices to operate in a specific manner; and thus the computer-readable medium having instructions stored includes an article of manufacture that includes instructions that implement various aspects of the functions/actions specified in one or more blocks in the flow charts and/or block diagrams.

The computer-readable program instructions may also be loaded to a computer, a further programmable data processing apparatus, or a further device, so that a series of operating steps may be performed on the computer, the further programmable data processing apparatus, or the further device to produce a computer-implemented process, such that the instructions executed on the computer, the further programmable data processing apparatus, or the further device may implement the functions/actions specified in one or more blocks in the flow charts and/or block diagrams.

The flow charts and block diagrams in the drawings illustrate the architectures, functions, and operations of possible implementations of the systems, methods, and computer program products according to various embodiments of the present disclosure. In this regard, each block in the flow charts or block diagrams may represent a module, a program segment, or part of an instruction, the module, program segment, or part of an instruction including one or more executable instructions for implementing specified logical functions. In some alternative implementations, functions marked in the blocks may also occur in an order different from that marked in the accompanying drawings. For example, two successive blocks may actually be executed in parallel substantially, or they may be executed in an opposite order sometimes, depending on the functions involved. It should be further noted that each block in the block diagrams and/or flow charts as well as a combination of blocks in the block diagrams and/or flow charts may be implemented using a special hardware-based system that executes specified functions or actions, or using a combination of special hardware and computer instructions.

Various implementations of the present disclosure have been described above. The foregoing description is illustrative rather than exhaustive, and is not limited to the disclosed implementations. Numerous modifications and alterations are apparent to persons of ordinary skill in the art without departing from the scope and spirit of the illustrated implementations. The selection of terms used herein is intended to best explain the principles and practical applications of the implementations or the improvements to technologies on the market, or to enable other persons of ordinary skill in the art to understand the implementations disclosed herein.

The invention claimed is:

1. A method for data compression, including:
    determining an amount of data to be compressed in a storage system;
    determining, based on the amount of the data to be compressed, a target compression level for compressing the data to be compressed; and
    compressing the data to be compressed according to the target compression level, wherein the determining the target compression level includes:
    determining a first amount of data that the storage system can compress according to each of multiple candidate compression levels, wherein determining the first amount of data that the storage system can compress according to each candidate compression level includes:

acquiring a compression-level mapping table associated with total computing resources of the storage system, wherein the compression-level mapping table includes correspondence between multiple candidate compression levels and multiple second amounts, each second amount being the amount of data that the storage system can compress according to a corresponding candidate compression level; and determining the first amount corresponding to each candidate compression level based on the compression-level mapping table and determined computing resources.

2. The method according to claim 1, wherein determining the amount of the data to be compressed includes:

determining an amount of data to be stored that will be stored to the storage system;

determining a de-duplication rate of the data to be stored; and determining the amount of the data to be compressed based on the amount of the data to be stored and the de-duplication rate.

3. The method according to claim 1, wherein determining the amount of the data to be compressed includes:

determining an amount of data to be subject to collection processing in the storage system; and determining the amount of the data to be compressed based on the amount of the data to be subject to collection processing.

4. The method according to claim 1, wherein determining the target compression level includes:

determining computing resources in the storage system that are available to compress the data to be compressed; and selecting the target compression level from the multiple candidate compression levels so that the amount of the data to be compressed matches the first amount corresponding to the target compression level.

5. The method according to claim 4, wherein determining the computing resources includes:

detecting a ratio of an available portion of computing resources of the storage system to the total computing resources of the storage system; and determining the computing resources based on the total computing resources and the ratio.

6. The method according to claim 1, wherein determining the target compression level includes:

updating the target compression level in response to a change in at least one of the following:

computing resources in the storage system that are available to compress the data to be compressed; and the amount of the data to be compressed.

7. An electronic device, including:

a processor; and a memory coupled to the processor, wherein the memory has instructions stored therein that, when executed by the processor, cause the electronic device to perform actions including:

determining an amount of data to be compressed in a storage system;

determining, based on the amount of the data to be compressed, a target compression level for compressing the data to be compressed; and compressing the data to be compressed according to the target compression level, wherein the determining the target compression level includes:

determining a first amount of data that the storage system can compress according to each of multiple candidate compression levels, wherein the determining the first amount of data that the storage system can compress according to each candidate compression level includes:

acquiring a compression-level mapping table associated with total computing resources of the storage system, wherein the compression-level mapping table includes correspondence between multiple candidate compression levels and multiple second amounts, each second amount being the amount of data that the storage system can compress according to a corresponding candidate compression level; and determining the first amount corresponding to each candidate compression level based on the compression-level mapping table and determined computing resources.

8. The electronic device according to claim 7, wherein determining the amount of the data to be compressed includes:

determining an amount of data to be stored that will be stored to the storage system;

determining a de-duplication rate of the data to be stored; and determining the amount of the data to be compressed based on the amount of the data to be stored and the de-duplication rate.

9. The electronic device according to claim 7, wherein determining the amount of the data to be compressed includes:

determining an amount of data to be subject to collection processing in the storage system; and determining the amount of the data to be compressed based on the amount of the data to be subject to collection processing.

10. The electronic device according to claim 7, wherein determining the target compression level includes:

determining computing resources in the storage system that are available to compress the data to be compressed; and selecting the target compression level from the multiple candidate compression levels so that the amount of the data to be compressed matches the first amount corresponding to the target compression level.

11. The electronic device according to claim 10, wherein determining the computing resources includes:

detecting a ratio of an available portion of computing resources of the storage system to the total computing resources of the storage system; and determining the computing resources based on the total computing resources and the ratio.

12. The electronic device according to claim 7, wherein determining the target compression level includes:

updating the target compression level in response to a change in at least one of the following:

computing resources in the storage system that are available to compress the data to be compressed; and the amount of the data to be compressed.

13. A computer program product that is tangibly stored on a computer-readable storage medium and includes machine-executable instructions, wherein the machine-executable instructions, when executed, cause a machine to perform actions, the actions comprising:

determining an amount of data to be compressed in a storage system;

determining, based on the amount of the data to be compressed, a target compression level for compressing the data to be compressed; and     compressing the data to be compressed according to the target compression level, wherein the determining the target compression level includes:

determining a first amount of data that the storage system can compress according to each of multiple candidate compression levels, wherein the determining the first amount of data that the storage system can compress according to each candidate compression level includes:

acquiring a compression-level mapping table associated with total computing resources of the storage system, wherein the compression-level mapping table includes correspondence between multiple candidate compression levels and multiple second amounts, each second amount being the amount of data that the storage system can compress according to a corresponding candidate compression level; and     determining the first amount corresponding to each candidate compression level based on the compression-level mapping table and determined computing resources.

14. The computer program product according to claim 13, wherein determining the amount of the data to be compressed includes:

determining an amount of data to be stored that will be stored to the storage system;

determining a de-duplication rate of the data to be stored; and     determining the amount of the data to be compressed based on the amount of the data to be stored and the de-duplication rate.

15. The computer program product according to claim 13, wherein determining the amount of the data to be compressed includes:

determining an amount of data to be subject to collection processing in the storage system; and     determining the amount of the data to be compressed based on the amount of the data to be subject to collection processing.

16. The computer program product according to claim 13, wherein determining the target compression level includes:

determining computing resources in the storage system that are available to compress the data to be compressed;

and selecting the target compression level from the multiple candidate compression levels so that the amount of the data to be compressed matches the first amount corresponding to the target compression level.

17. The computer program product according to claim 16, wherein determining the computing resources includes:

detecting a ratio of an available portion of computing resources of the storage system to the total computing resources of the storage system; and     determining the computing resources based on the total computing resources and the ratio.

\* \* \* \* \*